United States Patent
Chen (10) Patent No.: US 7,075,230 B2
(45) Date of Patent: Jul. 11, 2006

(54) ORGANIC LIGHT EMITTING DIODE STRUCTURE

(75) Inventor: Yun-Sheng Chen, Kao-Hsiung (TW)

(73) Assignee: AU Optronics Corp., Hsin-Chu (TW)

( * ) Notice: Subject to any disclaimer, the term of this patent is extended or adjusted under 35 U.S.C. 154(b) by 270 days.

(21) Appl. No.: 10/707,493

(22) Filed: Dec. 18, 2003

(65) Prior Publication Data

US 2004/0232831 A1    Nov. 25, 2004

(30) Foreign Application Priority Data

May 20, 2003   (TW) ............................... 92113642 A (51) Int. Cl.
*H05B 33/00*    (2006.01)

(52) U.S. Cl. ...................................... 313/506; 313/512

(58) Field of Classification Search ........ 313/504–506; 428/690

See application file for complete search history.

(56) References Cited

U.S. PATENT DOCUMENTS 5,321,295 A *  6/1994  Hisamoto ................... 257/401
6,306,559 B1 * 10/2001  Tanamura et al. .......... 430/315

* cited by examiner

*Primary Examiner*—Joseph Williams
(74) *Attorney, Agent, or Firm*—Winston Hsu (57) ABSTRACT

An organic light emitting diode (OLED) structure includes a transparent conductive layer disposed on a top surface of a substrate, an organic thin film disposed on the transparent conductive layer and covering the transparent conductive layer, and a metal layer disposed on the organic thin film. A width of a bottom surface of the transparent conductive layer is greater than a width of a top surface of the transparent conductive layer.

19 Claims, 6 Drawing Sheets

ORGANIC LIGHT EMITTING DIODE STRUCTURE

BACKGROUND OF INVENTION

1. Field of the Invention

The present invention relates to an organic light emitting diode (OLED) structure, and more particularly, to an organic light emitting diode structure for avoiding over concentrated current and defects, such as cracks and spots.

2. Description of the Prior Art

In various types of flat panel displays, since an OLED, being developed later than a liquid crystal display (LCD), has many beneficial characteristics, such as having a spontaneous light source, a wide viewing angle, high response velocity, power saving, strong contrast, high brightness, small thickness, full-color, simpler structure, and a wide operating temperature, the OLED has been used extensively in small and medium scale portable display fields. After continuous research and development by manufacturers and scholars, the break through of some unresolved problems, such as low yield rate, unsatisfied mask application, unstable cap seal, has provided eminent progress. In the future, the OLED is even probably to be used in the large scaled display field.

Figure 1:
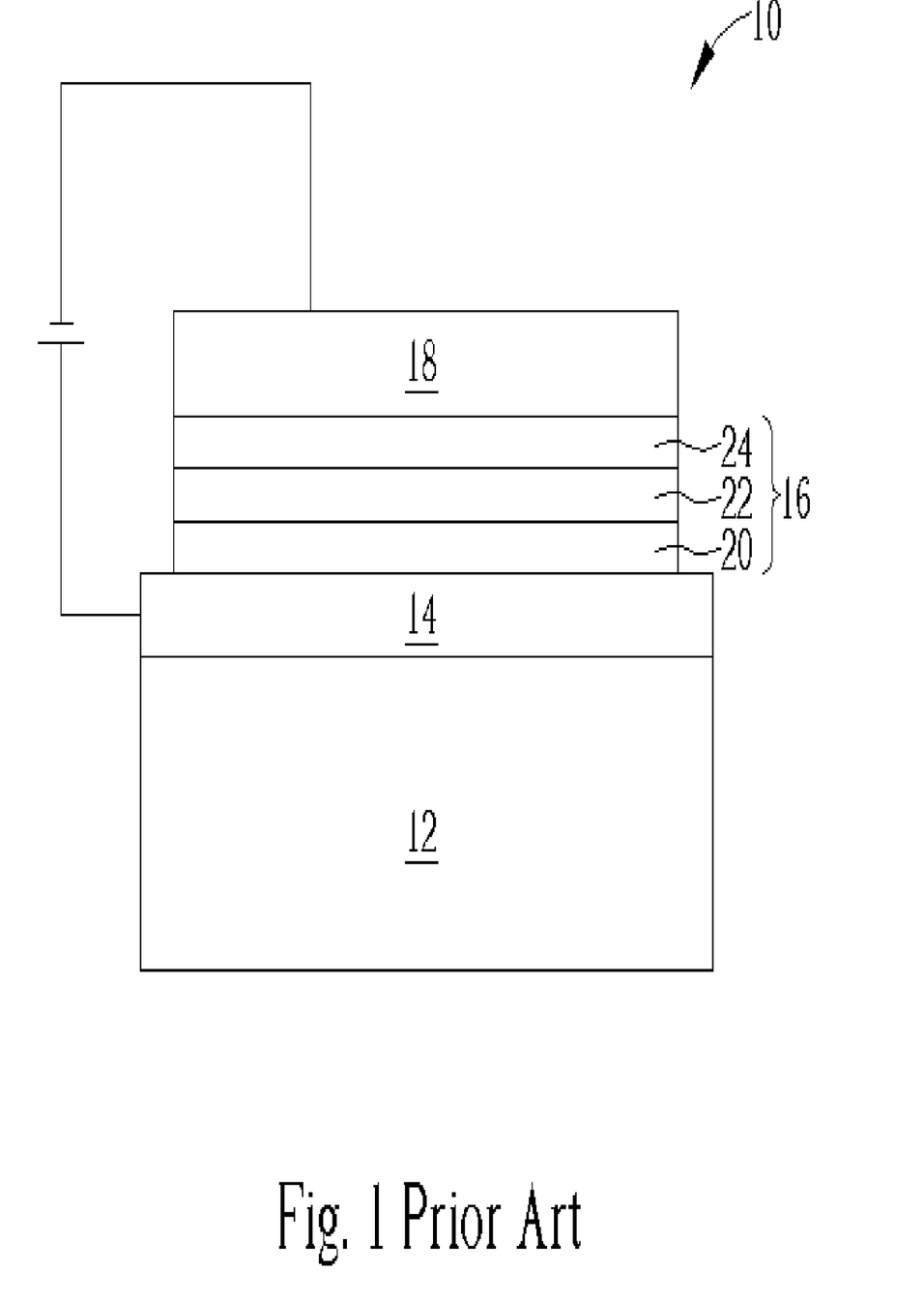
FIG. 1 is a cross-sectional view illustrating a conventional OLED structure.

Referring to FIG. 1. FIG. 1 is a cross-sectional view illustrating a conventional OLED structure 10. As shown in FIG. 1, the conventional OLED structure 10 mainly comprises a transparent glass substrate 12, a transparent conductive layer 14 being used as an anode of the OLED structure 10 and disposed on the glass substrate 12, an organic thin film 16 disposed on the transparent conductive layer 14, and a metal layer 18 being used as a cathode of the OLED structure 10 and disposed on the organic thin film 16.

The transparent conductive layer 14 comprises an indium tin oxide (ITO) layer or an indium zinc oxide (IZO) layer. The organic thin film 16 further comprises a hole transport layer (HTL) 20, an emitting layer (EL) 22, and an electron transport layer (ETL) 24 disposed on the transparent conductive layer 14 sequentially. The organic thin film 16 is formed by a thermal evaporation method. The hole transport layer 20 is composed of a diamine compound. The metal layer 18, composed of a metal having a low working function or an alloy, comprises a magnesium layer (Mg layer), an aluminum layer (Al layer), or a lithium/silver alloy layer (Li/Ag alloy layer).

In practical application, a hole injection layer (HIL, not shown) may be disposed between the transparent conductive layer 14 and the hole transport layer 20, and an electron injection layer (EIL, not shown) may be disposed between the metal layer 18 and the electron transport layer 24, depending on the requirements of devices and processes. Therefore, the problem of poor junctions of the organic thin film 16 and the anode/cathode is improved to help electrons or holes injected into the organic thin film 16. Furthermore, the emitting layer having an ability of transporting electrons and the hole transport layer having an emitting ability are optionally utilized to reduce the use of the organic thin film so as to simplify processing.

When a DC voltage is applied to the OLED structure 10, electrons in the metal layer 18 (cathode) and holes in the transparent conductive layer 14 (anode) will be injected into the emitting layer 22 through the electron transport layer 24 and the hole transport layer 20, respectively. Due to the potential difference incurred from the external electrical field, electrons and holes will move in the emitting layer 22 and recombine as excitions. When the excitions come back to the ground state by way of releasing energy, a specific percentage of energy (e.g. the quantum efficiency) is released in a form of photons to emit light downwards through the glass substrate 12. This is the electroluminescent principle of the OLED structure 10.

Figure 2:
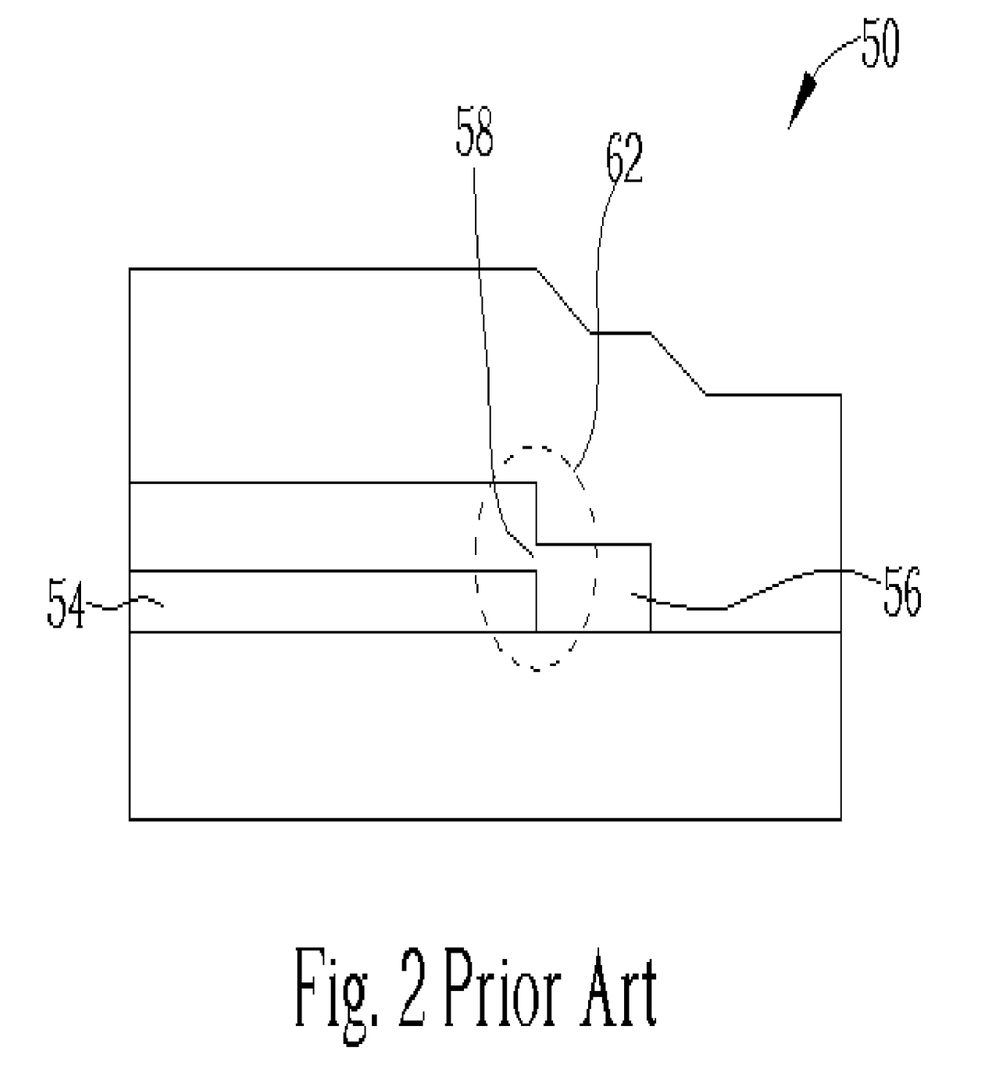
FIGS. 2–4 are cross-sectional views illustrating defects in a conventional OLED structure.
Figure 3:
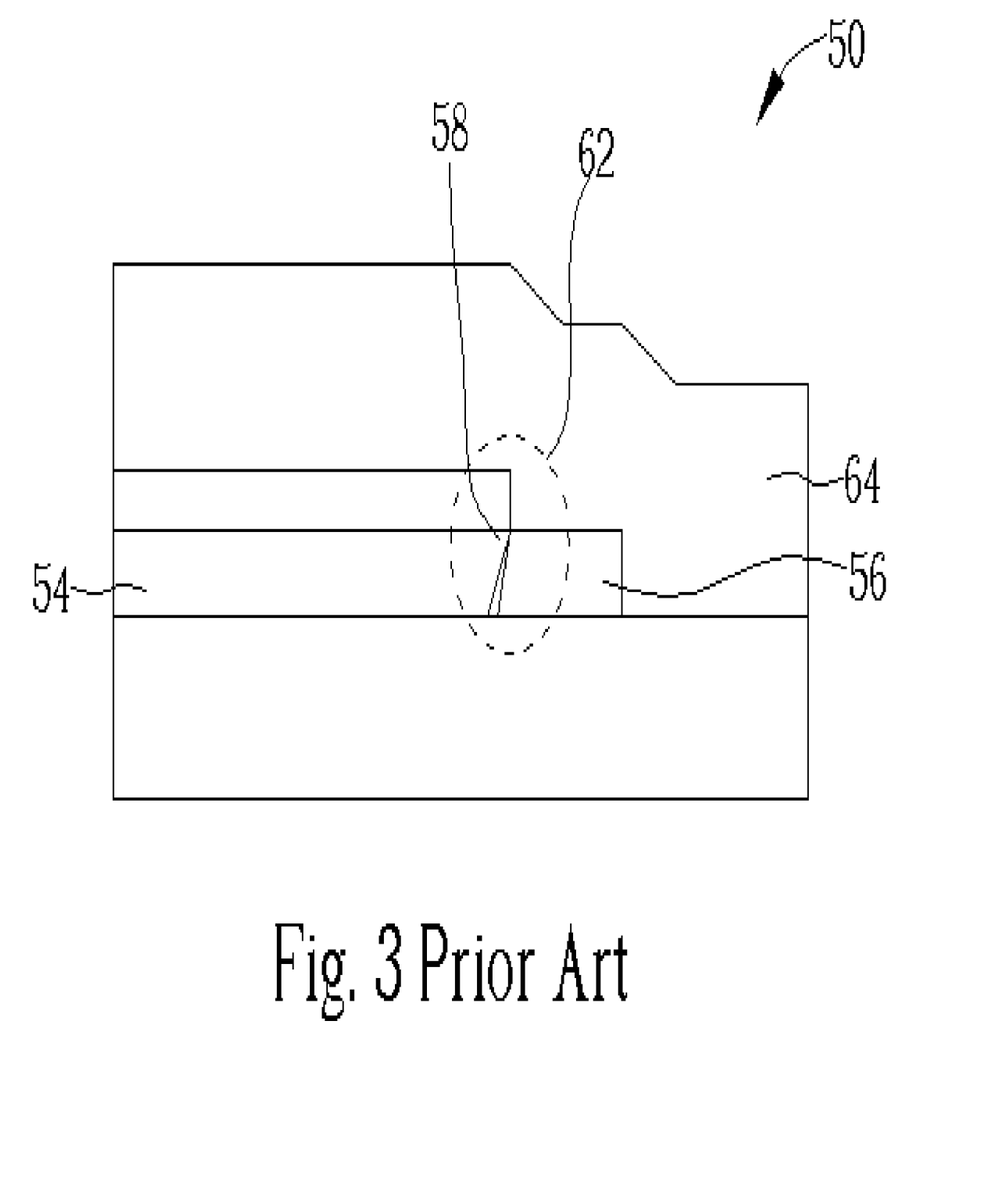
Figure 4:
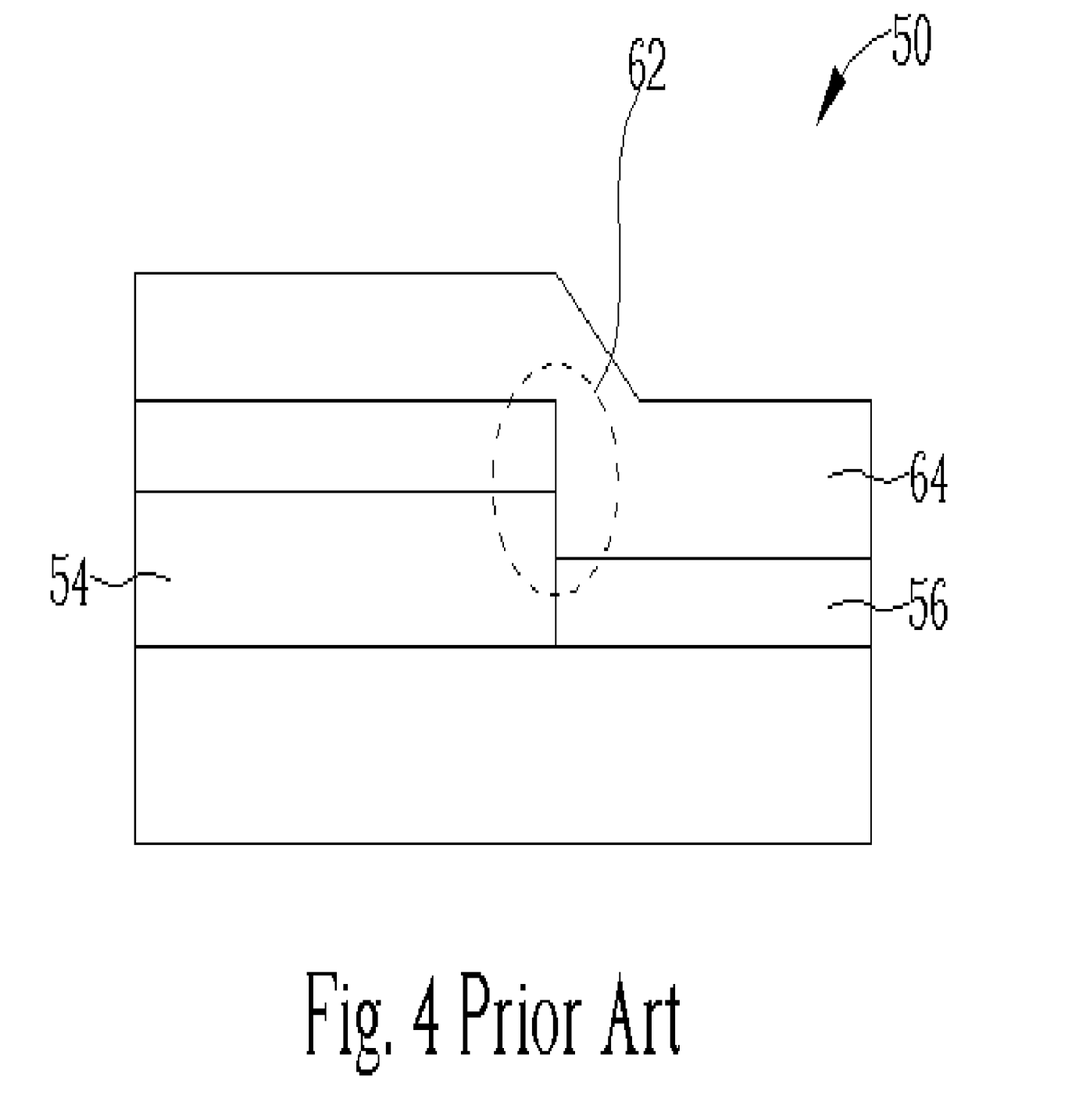

However, such a perfect situation must be based on the premise that each layer in the OLED structure 10 is undamaged. Referring to FIGS. 2–4. FIGS. 2–4 are cross-sectional views illustrating defects in a conventional OLED structure 50. As shown in FIG. 2, when forming a transparent conductive layer 54, an entire transparent conductive thin film (not shown) is formed first, followed by a wet etching process by utilizing an oxalic acid to form the transparent conductive layer 54. Since the wet etching process tends to incur the undercut phenomenon, and the crystallinity of the upper portion of the transparent conductive thin film (not shown) is superior to that of the lower portion of the transparent conductive thin film (not shown), the thin film in the lower portion of the transparent conductive thin film is more easily etched. As a result, an edge 58 of a top surface of the transparent conductive layer 54 becomes a right angle. In addition, the organic thin film 56 has a characteristic of poor step coverage ability to cause a very thin organic thin film 56 at the boundary 62 of the transparent conductive layer 54 and the organic thin film 56. When applying a voltage on the OLED structure 50, the current density at the boundary 62 of the transparent conductive layer 54 and the organic thin film 56 is too high, owing to electrical field distribution, causing rapid deterioration of the organic thin film 56.

As shown in FIG. 3, when the etching problem of the transparent conductive layer 54 becomes more severe, the edge 58 of the top surface of the transparent conductive layer 54 even becomes an acute angle. Thus, the deposited organic thin film 56 does not adhere to a sidewall of the transparent conductive layer 54 successfully, resulting in the crack phenomenon of the organic thin film 56 at the boundary 62 of the transparent conductive layer 54 and the organic thin film 56. As shown in FIG. 4, when the deposition or etching uniformity of the transparent conductive layer 54 is too bad in an extreme case, and a thickness of a portion of the transparent conductive layer 54 is greater than a thickness of the organic thin film, the transparent conductive layer 54, being used as the anode, may even cause a short circuit with a metal layer 64, being used as a cathode, at the boundary 62 to generate spots on products.

Therefore, it is very important to develop an OLED structure to avoid the over high current density problem incurred from the concentrated electrical field at the boundary of the transparent conductive layer and the organic thin film. Not only is the crack phenomenon of the organic thin film at the boundary of the transparent conductive layer and the organic thin film improved, but also the probability of generating spots in the OLED structure due to the short circuiting of the anode and the cathode is reduced.

SUMMARY OF INVENTION

It is therefore one object of the present invention to provide an organic light emitting diode structure, especially an organic light emitting diode structure to avoid the above mentioned problems.

According to the present invention, an organic light emitting diode (OLED) structure comprises a transparent conductive layer disposed on a top surface of a substrate, an organic thin film disposed on the transparent conductive layer and covering the transparent conductive layer, and a metal layer disposed on the organic thin film. A width of a bottom surface of the transparent conductive layer is greater than a width of a top surface of the transparent conductive layer.

Since the width of the bottom surface of the transparent conductive layer is greater than that of the top surface of the transparent conductive layer, the transparent conductive layer has a step structure on the top surface of the transparent conductive layer or a tilt angle greater than 90degrees formed between the top surface of the transparent conductive layer and the sidewall of the transparent conductive layer, and the thickness of the transparent conductive layer is smaller than the thickness of the organic thin film according to the OLED structure of the present invention, the deposited organic thin film is able to adhere to the sidewall of the transparent conductive layer successfully under these premises even though the organic thin film has a poor step coverage ability. Therefore, not only is the transparent conductive layer completely covered, but also the phenomena of over high current density at the edge of the transparent conductive layer, cracks, and spots are avoided. By applying the OLED structure of the present invention to a practical production line, products having good electrical performance, good high reliability performance, and long lifetime are able to be fabricated.

These and other objectives of the present invention will be apparent to those of ordinary skill in the art after having read the following detailed description of the preferred embodiment that is illustrated in the various figures and drawings.

DETAILED DESCRIPTION

Figure 5:
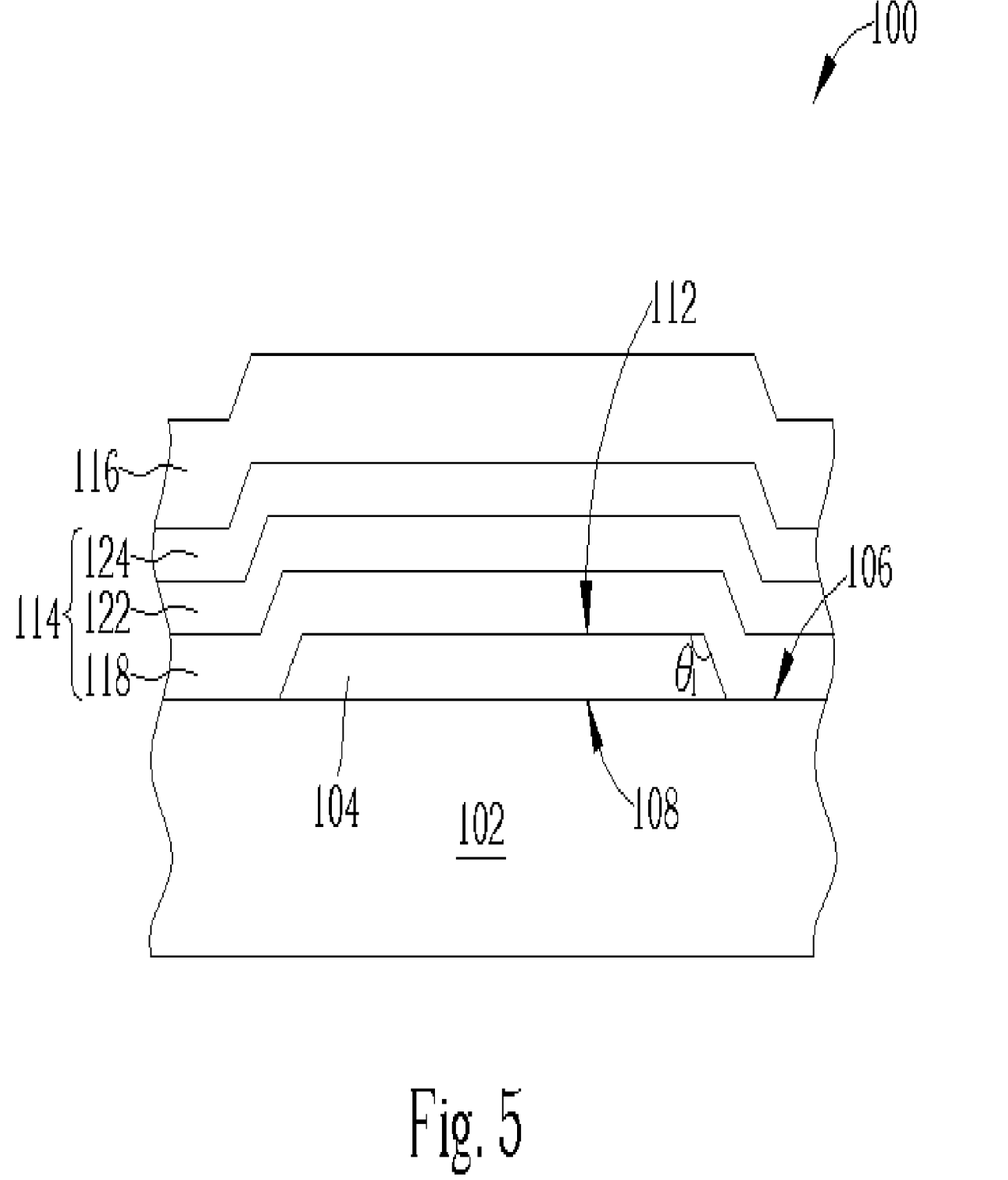
FIG. 5 is a cross-sectional view illustrating an OLED structure according to a first preferred embodiment of the present invention.

Referring to FIG. 5. FIG. 5 is a cross-sectional view illustrating an OLED structure 100 according to a first preferred embodiment of the present invention. As shown in FIG. 5, the OLED structure 100 of the present invention comprises a substrate 102, a transparent conductive layer 104 being used as an anode of the OLED structure 100 and disposed on a top surface 106 of the substrate 102, an organic thin film 114 disposed on the transparent conductive layer 104 and covering the transparent conductive layer 104, and a metal layer 116 being used as a cathode of the OLED structure 100 and disposed on the organic thin film 114. A width of a bottom surface 108 of the transparent conductive layer 104 is greater than a width of a top surface 112 of the transparent conductive layer 104.

According to the first preferred embodiment of the present invention, the substrate 102 comprises a glass substrate, a quartz substrate, or a metal substrate. The transparent conductive layer 104, composed of a transparent conductive material, comprises an indium tin oxide layer or an indium zinc oxide layer. The organic thin film 114 further comprises a hole transport layer 118, an emitting layer 122, and an electron transport layer 124 disposed on the transparent conductive layer 104 sequentially. The organic thin film 114 is formed by a thermal evaporation method. The hole transport layer 118 is composed of a diamine compound. The metal layer 116, composed of a metal having a low working function or an alloy, comprises a magnesium layer (Mg layer), an aluminum layer (Al layer), a lithium layer (Li layer), or an alloy layer.

In practical application, a hole injection layer (not shown) may be disposed between the transparent conductive layer 104 and the hole transport layer 118, and an electron injection layer (not shown) may be disposed between the metal layer 116 and the electron transport layer 124, depending on the requirements of devices and processes. Therefore, the problem of poor junctions of the organic thin film 114 and the anode/cathode is improved to help electrons or holes injected into the organic thin film 114. Furthermore, the emitting layer having an ability of transporting electrons and the hole transport layer having an emitting ability are optionally utilized to reduce the use of the organic thin film so as to simplify processing.

In the present invention, a tilt angle $\theta_1$ greater than 90 degrees is formed between the top surface 112 of the transparent conductive layer 104 and a sidewall of the transparent conductive layer 104, and a thickness of the transparent conductive layer 104 is smaller than a thickness of the organic thin film 114. The thickness of the transparent conductive layer 104 is greater than or approximately equal to 400 angstroms (Å), and the thickness of the organic thin film 114 is greater than or approximately equal to 1000 angstroms (Å). Under these two premises, even though the organic thin film 114 has a characteristic of poor step coverage ability, the deposited organic thin film 114 is able to adhere to the sidewall of the transparent conductive layer 104 successfully to completely cover the transparent conductive layer 104. As a result, the phenomena of the overly thin organic thin film 114 at the edge of the transparent conductive layer 104, too big step of the organic thin film 114, and the short circuiting of the transparent conductive layer 104 and the metal layer 116 are avoided effectively to prevent the current density, generated at the edge of the transparent conductive layer 104, from being too high and the phenomena of cracks and spots.

In order to form the transparent conductive layer 104 having a tilt angle greater than 90 degrees, an entire transparent conductive thin film (not shown) is formed on the substrate 102 first. It is worth noticing that various parameters must be adjusted when forming the transparent conductive thin film (not shown), and the annealing temperature must be well controlled during the post-annealing process after forming the transparent conductive thin film (not shown). The transparent conductive thin film (not shown) having expected crystallinity is thus formed. In addition, the dry etching process that does not have a severe undercut phenomenon is utilized to form the transparent conductive layer 104. Furthermore, parameters, such as the substrate temperature, the chamber pressure, the species and proportion of the etching gases, the biased voltage applied to the substrate, and the plasma type utilized for the etching process, need to be controlled when the dry etching process is proceeding to form the transparent conductive layer 104 having an ideal shape.

Figure 6:
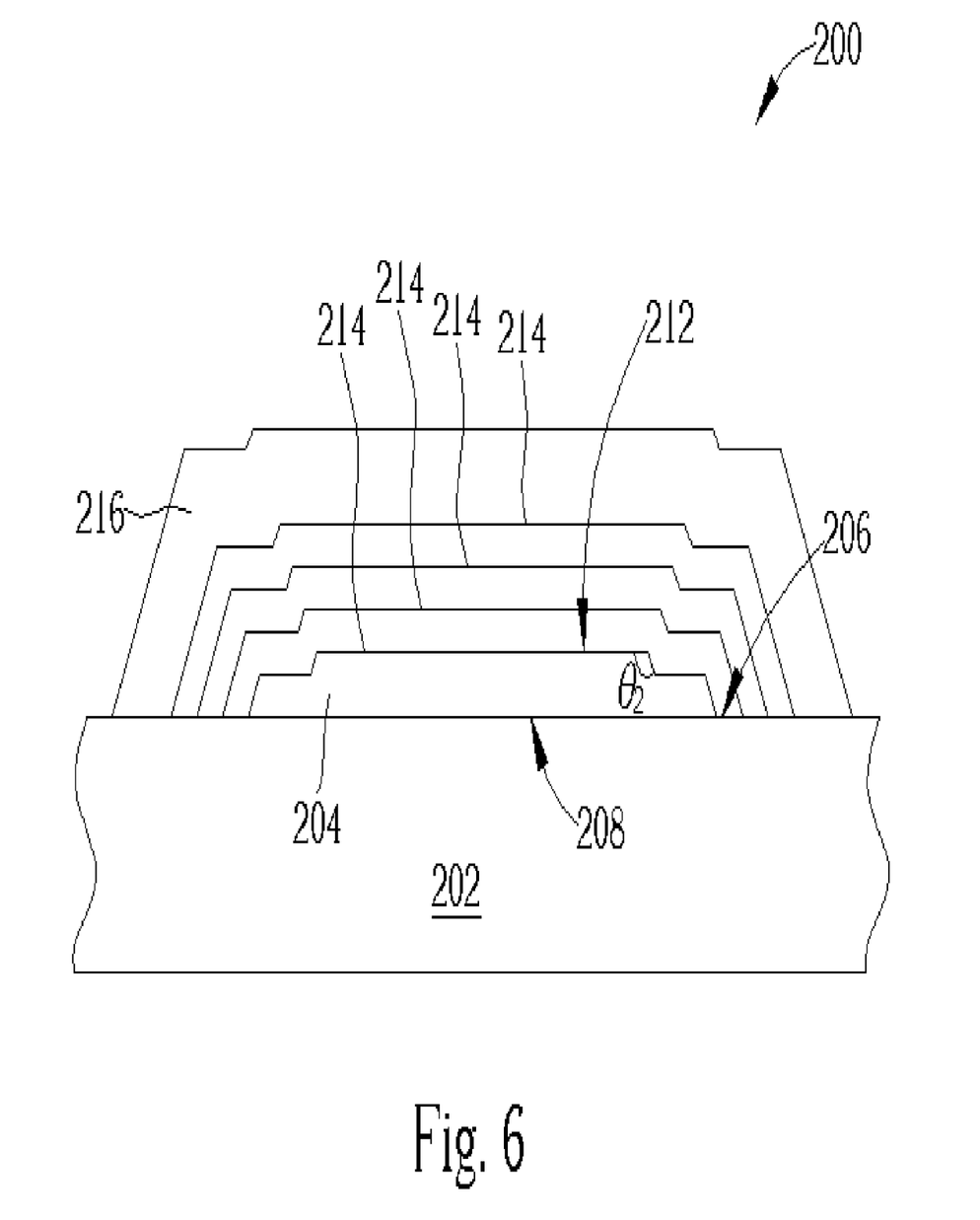
FIG. 6 is a cross-sectional view illustrating an OLED structure according to a second preferred embodiment of the present invention.

Referring to FIG. 6. FIG. 6 is a cross-sectional view illustrating an OLED structure 200 according to a second preferred embodiment of the present invention. As shown in FIG. 6, the OLED structure 200 of the present invention comprises substrate 202, a transparent conductive layer 204 being used as an anode of the OLED structure 200 and disposed on a top surface 206 of the substrate 202, an organic thin film 214 disposed on the transparent conductive layer 204 and covering the transparent conductive layer 204, and a metal layer 216 being used as a cathode of the OLED structure 200 and disposed on the organic thin film 214. A width of a bottom surface 208 of the transparent conductive layer 204 is greater than a width of a top surface 212 of the transparent conductive layer 204. Since the substrate 202 and each layer in the OLED structure 200 in the second preferred embodiment of the present invention is the same as the substrate 102 and each layer disclosed in the first preferred embodiment of the present invention, they are not mentioned redundantly.

The feature of the second preferred embodiment of the present invention is that the transparent conductive layer 204 has a step structure on the top surface thereof, and a tilt angle $\theta_2$ approximately equal to 90 degrees is formed on the step structure. In addition, a thickness of the transparent conductive layer 204 is smaller than a thickness of the organic thin film 214. The thickness of the transparent conductive layer 204 is greater than or approximately equal to 400 angstroms (Å), and the thickness of the organic thin film 214 is greater than or approximately equal to 1000 angstroms (Å). Under these two premises, even though the organic thin film 214 has a characteristic of poor step coverage ability, the deposited organic thin film 214 is able to adhere to the sidewall of the transparent conductive layer 204 successfully to completely cover the transparent conductive layer 204. Therefore, the phenomena of the overly thin organic thin film 214 at the edge of the transparent conductive layer 204, too big step of the organic thin film 214, and the short circuiting of the transparent conductive layer 204 and the metal layer 216 are avoided effectively to prevent the current density, generated at the edge of the transparent conductive layer 204, from being too high and the phenomena of cracks and spots.

In order to form the transparent conductive layer 204 having the step structure on the top surface and having a tilt angle $\theta_2$ approximately equal to 90 degrees on the step structure, an entire transparent conductive thin film (not shown) is formed on the substrate 202 first. It is worth noticing that various parameters must be adjusted when forming the transparent conductive thin film (not shown), and the annealing temperature must be well controlled during the post-annealing process after forming the transparent conductive thin film (not shown). The transparent conductive thin film (not shown) having expected crystallinity is thus formed. For example, the transparent conductive thin film (not shown) having different degrees of crystallinity in the upper layer portion and the lower layer portion is formed to allow the transparent conductive layer 204 having the step structure to be formed after subsequent etching process. Furthermore, the present invention may utilize a selective mask to allow the exposing process and the development process to be performed. That means, the selective mask is formed on the transparent conductive thin film (not shown) followed by the etching process. In addition, the wet etching process and the dry etching process may be alternately utilized to form the transparent conductive layer 204 having the step structure.

Since the transparent conductive layer in the OLED structure of the present invention has a very special shape, and the thickness of the transparent conductive layer is smaller than the thickness of the organic thin film, the organic thin film is ready to adhere to the transparent conductive layer to overcome the problems of over high current density, cracks, and spots, that always happen in the OLED structure of the prior art. By applying the OLED structure of the present invention to a practical production line, products having good electrical performance, good high reliability performance, and long lifetime are able to be fabricated.

In comparison with the prior art OLED structure, the width of the bottom surface of the transparent conductive layer is greater than that of the top surface of the transparent conductive layer, the transparent conductive layer has a step structure on the top surface thereof or a tilt angle greater than 90 degrees formed between the top surface of the transparent conductive layer and the sidewall of the transparent conductive layer, and the thickness of the transparent conductive layer is smaller than the thickness of the organic thin film according to the OLED structure of the present invention. Under these premises, even though the organic thin film has a characteristic of poor step coverage ability, the deposited organic thin film is able to adhere to the sidewall of the transparent conductive layer successfully to completely cover the transparent conductive layer. Therefore, the phenomena of over high current density at the edge of the transparent conductive layer, cracks, and spots are avoided. In addition, since the OLED structure of the present invention has the abovementioned advantages, the high reliability performance of devices is better at not causing damage to devices due to continuous use.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An organic light emitting diode (OLED) structure comprising:
    a transparent conductive layer disposed on a top surface of a substrate, a width of a bottom surface of the transparent conductive layer being greater than a width of a top surface of the transparent conductive layer;
    an organic thin film disposed on the substrate, the organic thin film covering the transparent conductive layer and the edges of the transparent conductive layer; and
    a metal layer disposed on the organic thin film.

2. The structure of claim 1 wherein the substrate comprises a glass substrate, a quartz substrate, or a metal substrate.

3. The structure of claim 1 wherein the transparent conductive layer comprises an indium tin oxide (ITO) layer or an indium zinc oxide (IZO) layer, and the transparent conductive layer is used as an anode of the organic light emitting diode.

4. The structure of claim 1 wherein a tilt angle greater than 90 degrees is formed between the top surface of the transparent conductive layer and a sidewall of the transparent conductive layer.

5. The structure of claim 1 wherein a thickness of the transparent conductive layer is smaller than a thickness of the organic thin film.

6. The structure of claim 5 wherein the thickness of the transparent conductive layer is greater than or approximately equal to 400 angstroms (Å).

7. The structure of claim 5 wherein the thickness of the organic thin film is greater than or approximately equal to 1000 angstroms (Å).

8. The structure of claim 1 wherein the organic thin film further comprises a hole transport layer (HTL) disposed on a surface of the transparent conductive layer, an emitting layer (EL) disposed on a surface of the hole transport layer, and an electron transport layer (ETL) disposed on a surface of the emitting layer.

9. The structure of claim 8 further comprising a hole injection layer (HIL) disposed between the transparent conductive layer and the hole transport layer, and an electron injection layer (EIL) disposed between the electron transport layer and the metal layer.

10. The structure of claim 1 wherein the metal layer comprises a magnesium layer (Mg layer), an aluminum layer (Al layer), a lithium layer (Li layer), or an alloy layer, and the metal layer is used as a cathode of the organic light emitting diode.

11. An organic light emitting diode structure comprising:
a transparent conductive layer having a step structure on a top surface thereof disposed on a top surface of a substrate, a width of a bottom surface of the transparent conductive layer being greater than a width of a top surface of the transparent conductive layer;
an organic thin film disposed on the substrate, the organic thin film covering the transparent conductive layer and the edges of the transparent conductive layer; and
a metal layer disposed on the organic thin film.

12. The structure of claim 11 wherein the substrate comprises a glass substrate, a quartz substrate, or a metal substrate.

13. The structure of claim 11 wherein the transparent conductive layer comprises an indium tin oxide (ITO) layer or an indium zinc oxide (IZO) layer, and the transparent conductive layer is used as an anode of the organic light emitting diode.

14. The structure of claim 11 wherein a tilt angle approximately equal to 90 degrees is formed on the step structure.

15. The structure of claim 11 wherein a thickness of the transparent conductive layer is smaller than a thickness of the organic thin film.

16. The structure of claim 15 wherein the thickness of the transparent conductive layer is greater than or approximately equal to 400 angstroms (Å), and the thickness of the organic thin film is greater than or approximately equal to 1000 angstroms (Å).

17. The structure of claim 11 wherein the organic thin film further comprises a hole transport layer (HTL) disposed on a surface of the transparent conductive layer, an emitting layer (EL) disposed on a surface of the hole transport layer, and an electron transport layer (ETL) disposed on a surface of the emitting layer.

18. The structure of claim 17 further comprising a hole injection layer (HIL) disposed between die transparent conductive layer and the hole transport layer, and an electron injection layer (EIL) disposed between the electron transport layer and the metal layer.

19. The structure of claim 11 wherein the metal layer comprises a magnesium layer (Mg layer), an aluminum layer (Al layer), a lithium layer (Li layer), or an alloy layer, and the metal layer is used as a cathode of the organic light emitting diode.

* * * * *